(12) United States Patent
Li et al.

(10) Patent No.: US 7,440,862 B2
(45) Date of Patent: Oct. 21, 2008

(54) COMBINING MULTIPLE INDEPENDENT SOURCES OF INFORMATION FOR CLASSIFICATION OF DEVICES UNDER TEST

(75) Inventors: Jonathan Qiang Li, Mountain View, CA (US); Daniel A. Usikov, Newark, CA (US)

(73) Assignee: Agilent Technologies, Inc., Santa Clara, CA (US)

( * ) Notice: Subject to any disclaimer, the term of this patent is extended or adjusted under 35 U.S.C. 154(b) by 0 days.

(21) Appl. No.: 10/842,290

(22) Filed: May 10, 2004

(65) Prior Publication Data
US 2005/0251370 A1 Nov. 10, 2005

(51) Int. Cl.
*G06F 11/00* (2006.01)
*G06F 17/00* (2006.01)
(52) U.S. Cl. ...................................... 702/108; 702/181
(58) Field of Classification Search ................. 702/190, 702/179, 181, 35, 117, 118, 183, 185, 36, 702/40, 58, 59, 81, 194; 706/908, 916; 703/2; 382/147, 149; 714/26
See application file for complete search history.

(56) References Cited

U.S. PATENT DOCUMENTS

| | | | | |
|---|---|---|---|---|
| 5,130,936 A | * | 7/1992 | Sheppard et al. | ............. 702/123 |
| 5,293,323 A | * | 3/1994 | Doskocil et al. | ............. 702/185 |
| 5,550,751 A | * | 8/1996 | Russell | ........................ 700/293 |
| 5,631,857 A | | 5/1997 | Kobrosly et al. | ............. 702/194 |
| 5,802,256 A | * | 9/1998 | Heckerman et al. | ............ 706/59 |
| 5,922,079 A | | 7/1999 | Booth et al. | .................... 714/26 |
| 5,950,147 A | * | 9/1999 | Sarangapani et al. | ......... 702/179 |
| 6,785,636 B1 | * | 8/2004 | Darken et al. | ................ 702/185 |
| 6,879,973 B2 | * | 4/2005 | Skaanning et al. | ............. 706/52 |
| 2002/0103776 A1 | * | 8/2002 | Bella et al. | ..................... 706/49 |
| 2004/0218832 A1 | * | 11/2004 | Luo et al. | ..................... 382/274 |
| 2005/0071432 A1 | * | 3/2005 | Royston, III | ................. 709/206 |
| 2005/0075995 A1 | * | 4/2005 | Stewart et al. | ................. 706/52 |

OTHER PUBLICATIONS

Jaynes, E. T., "Probability Theory the Logic of Science", Cambridge University Press, 2003, cover page and table of contents—12 pages; Chapter II, 10 pages, no month.
Brosa et al., Title: "On Maximizing The Coverage Of Catastrophic And Parametric Faults", Journal Of Electronic Testing, Kluwer Academic Publishers, Dordrecht, NL, vol. 16, No. 3, Jun. 2000, pp. 251-258.
Coudert, Title: "Institute Of Electrical And Electronics Engineers: On Solving Covering Problems Logic Synthesis", Jun. 3, 19996, Proceedings Of The 33rd. Design Automation Conference 1996. Las Vages, Jun. 3-7, 1996, Proceedings Of The Design Automation p. 197-202.
Flores et al., Title: "On Applying Set Covering Models To Test Set Compaction", Mar. 4, 1999, VLSI, 1999. Proceedings. Ninth Great Lakes Symposium On Ypsilanti, MI, USA Mar. 4-6, 1999, Los Alamitos, CA ISA, IEEE Comput. SOC, US, pp. 8-11.

* cited by examiner

*Primary Examiner*—Hal D Wachsman

(57) ABSTRACT

Embodiments of the present invention use the results of a plurality of defect detecting tests and adjust the result of each test in a manner that reflects the accuracy of the test that produced it. A manufactured unit can then be evaluated using a mathematical combination of the adjusted results.

19 Claims, 3 Drawing Sheets

COMBINING MULTIPLE INDEPENDENT SOURCES OF INFORMATION FOR CLASSIFICATION OF DEVICES UNDER TEST

TECHNICAL FIELD

Embodiments of the present invention are directed to the field of device testing, and specifically to a system and method for evaluating manufactured devices using a plurality of testing techniques.

BACKGROUND OF THE INVENTION

When units, such as electronic components, or the like, are manufactured using modern automated processes, a certain percentage of those units will contain defects, missing pieces or other similar imperfections. For example, when printed circuit boards (PCBs), such as those used in cellular telephones, are manufactured, a percentage of the produced PCBs will be missing components. In order to ensure quality, manufacturers typically test the manufactured units for the presence of defects. For example, after a PCB has been manufactured, optical inspections are typically made of the PCB's surface. By comparing these images to known standard images, defects can be detected. These optical inspections may be color images used to determine surface quality, gray-scale images are used to determine whether a component is present or absent on the PCB, or even three dimensional images of the PCB surface used to determine the quality of solder joints. Other types of test such as electrical conductivity or x-ray imaging may be used as well. The type of test selected is typically a function of the type of unit being manufactured, the type of manufacturing process itself, the testing environment, or other similar consideration.

Most of the testing methods used to detect defects by comparing the results of a test on a newly manufactured unit to the results of a known standard. Optical inspection tests, such as those described above, for example, compare the image of a manufactured PCB to the image of a known "good" PCB. A defect can then be detected when the image of the PCB is perceptively different from the image of the known "good" PCB. Other methods use similar methods to detect the presence of various defects. For example, during manufacture, a malfunction may cause solder joints used to affix chips onto PCBs to overflow. Such a defect will often be detected using electrical connectivity tests in which the connectivity of a newly manufactured unit is measured and compared to the values of known "good" unit. If the measured value differs by more than a preset amount, the manufactured unit is considered defective.

Traditionally manufacturing techniques use only one testing technique to detect the presence of a defect. Typically, that test was chosen because it is considered the most suitable (or accurate) given the manufacturing process, the type of unit being manufactured, and the type of defects anticipated. For example, if color imaging produces the most accurate results for detecting the presence of a component, color imaging is used. If gray-scale imaging produces the most accurate results for detecting textual codes on an integrated circuit (IC) chip, gray-scale imaging is used. Some manufacturing techniques do use multiple tests, particularly if the manufacturer is testing for different types of defects. However, it can be difficult to effectively utilize multiple tests, because the tests may not be equally reliable and often produce inconsistent results. Thus, when multiple tests are used, a "majority rules" method of combining the test results is often employed, meaning that a device is considered defective only if it fails a majority of the tests.

BRIEF SUMMARY OF THE INVENTION

Embodiments of the present invention use the results of a plurality of defect detecting test and adjust the result of each test in a manner that reflects the accuracy of the test that produced the result. A manufactured unit can then be evaluated using a mathematical combination of the adjusted results.

Some embodiments predetermine the accuracy of each test by analyzing the results run on units with known defect profiles. These results can then be used to create weighting factors that are used with results of tests performed on newly manufactured units. The weighted results of each test may then be viewed as a likelihood that the tested unit contains a defect. By mathematically combining these likelihoods, a manufacturer can effectively use a multiple number of tests to evaluate manufactured units, even if those tests have different reliabilities.

Systems for evaluating a unit in accordance with the present invention may include a plurality of testing techniques that detect the presence of defects, if the accuracy of at least one of the techniques is capable of being determined. Embodiments may also include a processor, and code that weights the results from each technique using that technique's accuracy. Embodiments may then use code to combine the weighted results and calculate a probability that the unit is defective.

Embodiments may use a method in accordance with the present invention to evaluate a manufactured electronic device. Such embodiments test each of a plurality of techniques to determine how well they detect known manufacturing defects. After testing a newly manufactured device with each technique, the embodiments could adjust the result found by each technique to compensate for any determined inaccuracies. The embodiment would then calculate a probability that the device is defective by combining the adjusted results.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated that the conception and specific embodiment disclosed may be readily utilized as a basis for modifying or designing other structures for carrying out the same purposes of the present invention. It should also be realized that such equivalent constructions do not depart from the invention as set forth in the appended claims. The novel features which are believed to be characteristic of the invention, both as to its organization and method of operation, together with further objects and advantages will be better understood from the following description when considered in connection with the accompanying figures. It is to be expressly understood, however, that each of the figures is provided for the purpose of illustration and description only and is not intended as a definition of the limits of the present invention.

BRIEF DESCRIPTION OF THE DRAWINGS

For a more complete understanding of the present invention, reference is now made to the following descriptions taken in conjunction with the accompanying drawing, in which.

DETAILED DESCRIPTION OF THE INVENTION

Figure 1:
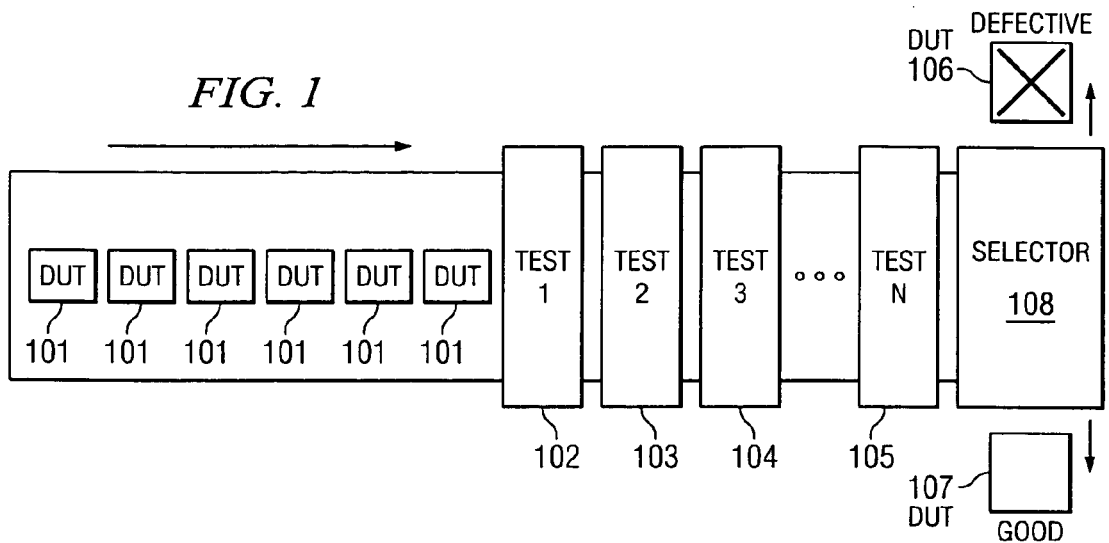
FIG. 1 illustrates a plurality of manufactured devices being tested for defects in accordance with an embodiment of the present invention.

FIG. 1 illustrates a plurality of manufactured devices being tested for defects in accordance with an embodiment of the present invention. Each device under test (DUT) 101 in system 100 is a manufactured unit that may contain a defect. Tests 102-105 are designed to detect the defects anticipated in the manufacture of DUT 101. The selection of the appropriate tests may depend upon the type of DUT manufactured, the environmental factors involved in manufacture, the types of defects likely to arise, physical constraints such as test access points of a printed circuit board, economic constraints such as the cost of testing, logistic constraints such as throughput requirements, and/or other like considerations. Embodiments of the present invention are not limited to any specific type of DUT, type of defect, or any testing arrangement. Rather embodiments of the present invention may be utilized to test any type of DUT, using any type of manufacturing technique, and with any type of testing technique that is capable of being weighed. After system 100 tests a DUT 101 with each test 102-105, the results of tests 102-105 are then used by selector 108 to separate defective DUT's 106 from good DUT's 107. DUTs 101 may be electronic components, printed circuit boards, any other manufactured item, such food products or toys capable of being tested by a plurality of weighted tests. Note that the embodiments of the present invention are not limited to the testing of manufactured products for quality control. The methods of the present invention can be used in procedures used in conjunction with airport screening, medical screening, or any other application that may utilize multiple testing mechanisms of varying quality or accuracy.

Figure 2:
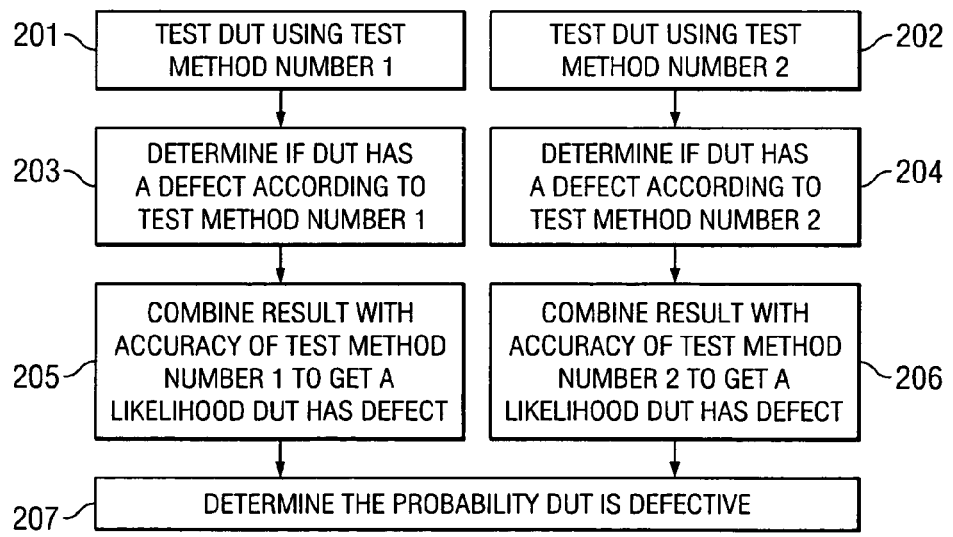
FIG. 2 is a flow chart illustrating a method of determining whether or not a device is defective in accordance with an embodiment of the present invention.

FIG. 2 is a flow chart illustrating a method of determining whether or not a DUT is defective in accordance with one embodiment of the present invention. The method 200 utilizes two testing methods, and passes or fails each DUT by calculating a probability that the DUT contains a defect from a weighed combination of the result of each test. It should be appreciated, however, that embodiments of the present invention are not limited to only two testing methods, but rather may be adapted to using any number of tests that are capable of producing weighed results. In step 201, a DUT is tested using test method number 1, and produces, in step 203, some determination of whether or not, according to test 1, the DUT has a defect. In step 205, the determination made in step 203 is weighed using some determination of the accuracy of test method number 1. The result is a likelihood that DUT has a defect, which is a combination of the outcome of test 1 and the confidence the operator has in the accuracy of test method number 1.

In step 202, the same DUT is tested using test method number 2. In step 204, the results of the second test are used to determine whether or not, according to test 2, the DUT has a defect. In step 206, this determination is weighted by a measurement of the accuracy of test method number 2. Step 207 calculates a probability that the DUT is defective by combining the weighted likelihoods produced by each test. In one embodiment of the invention, steps 203-207 may be performed by selection 108. In another embodiment of the invention steps 201-206 may be performed by tests 102 and 103 (e.g.)

Figure 3:
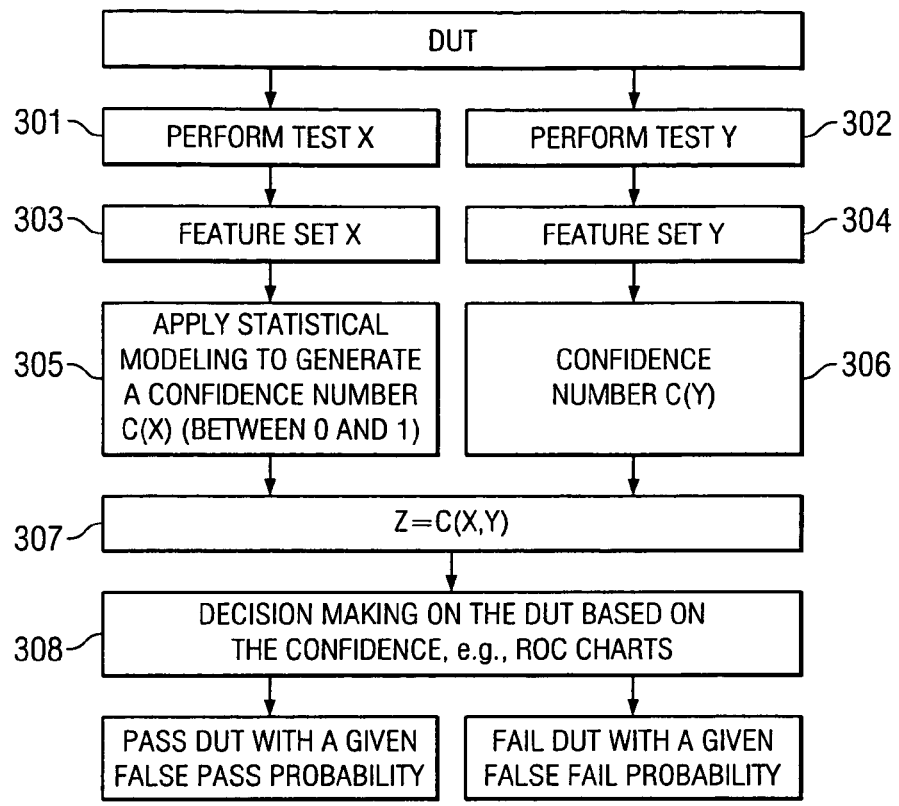
FIG. 3 is a process for training a system in accordance with an embodiment of the present invention.

In order to determine the confidence factor that "weighs" a testing method, a system may need to be "trained." FIG. 3 is a process for training a system in accordance with an embodiment of the present invention. In method 300, DUT 350 is a standard unit that has known characteristics and is subjected to testing using test X in step 301 and test Y in step 302. For clarity only two tests are illustrated, but the embodiments of the present invention are not limited to any specific number of tests. Further, the measurement X and measurement Y need not be related, but rather may be two independent information sources, for example color imaging and electrical connectivity, resulting in independent DUT measurements.

These measurements produce a feature set X, in step 303, and a feature set Y, in step 304. Feature sets X and Y are typically sets of multiple measurements taken at predetermined sample points on the DUT. Because the standard DUTs used to train a system have a known defect profile, the resulting feature sets will show how well test X and test Y detect the defects the operator knows are present. Once the feature set X and the feature set Y are measured for all the standard DUTs, steps 305 and 306 compare the feature sets X and Y to the known profiles for each standard DUT, and from this comparison determine how accurately each measurement X and Y has detected the defects in the standard DUTs. These results are typically expressed as a confidence factor for each test. Step 307 then combines the confidence factor for the measurements using X and Y to determine a final confidence Z, which represents how accurately a defect could be detected if both tests X and Y are used together. Using this factor Z, step 308 charts the probability of a false pass (a defective DUT being found not defective) and a false fail (a non-defective DUT found defective).

To compute the confidences used in the above example systems and methods, embodiments of the present invention may use any suitable statistical model. Used here by way of example and illustration is a Gaussian model. Feature set X found in step 303 of FIG. 3, may be represented by a matrix in which each column represents a measurement point and each row represents a measurement run. The following matrix of training data represents the results of X run on a standard at k number of measurement points and n number of times.

$$\begin{pmatrix} X_{11} & X_{12} & \ldots & X_{1k} \\ X_{21} & X_{22} & \ldots & X_{2k} \\ \ldots & & & \\ X_{n1} & X_{n2} & \ldots & X_{nk} \end{pmatrix}$$

It should be noted that a training method may, in the alternative, run test X at k number of measuring points and on an n number of samples and produce the same result.

Using this matrix the mean vector:

$$\overline{\mu} = \begin{pmatrix} \mu_1 \\ \mu_2 \\ \ldots \\ \mu_k \end{pmatrix}, \text{ where } \mu_j = (X_{1j} + X_{2j} + \ldots + X_{nj})/n$$

and the co-variance matrix for X where the $ij^{th}$ entry of this matrix is the covariance between feature i and feature j:

$$\sum = \begin{pmatrix} \sigma_{11}^2 & \sigma_{21} & \ldots & \sigma_{k1} \\ \sigma_{12} & \sigma_{22}^2 & \ldots & \\ \ldots & & \ldots & \\ \sigma_{1k} & & \ldots & \sigma_{kk}^2 \end{pmatrix}, \text{ where and}$$

$$\sigma_{ij} = [(X_{1i} - \mu_i)(X_{1j} - \mu_j) + (X_{2i} - \mu_i)(X_{2j} - \mu_j) + \ldots + (X_{ni} - \mu_i)(X_{nj} - \mu_j)]/(n-2)$$

For a typical testing method, a matrix, a mean vector, and a co-variance matrix are typically determined for an "A" class of standard DUTs, representing devices free from defects, and separately for a "B" class of standard DUTs, representing devices containing known defects.

A feature set of Y representing that of a testing method Y found in step 304 of FIG. 3, may be represented by the following matrix:

$$\begin{pmatrix} Y_{11} & Y_{12} & \ldots & Y_{1k} \\ Y_{21} & Y_{22} & \ldots & Y_{2k} \\ \ldots & & & \\ Y_{n1} & Y_{n2} & \ldots & Y_{nk} \end{pmatrix}$$

Using this matrix the mean vector:

$$\overline{\mu} = \begin{pmatrix} \mu_1 \\ \mu_2 \\ \ldots \\ \mu_k \end{pmatrix}, \text{ where } \mu_j = (Y_{1j} + Y_{2j} + \ldots + Y_{nj})/n$$

and the co-variance matrix:

$$\sum = \begin{pmatrix} \sigma_{11}^2 & \sigma_{21} & \ldots & \sigma_{k1} \\ \sigma_{12} & \sigma_{22}^2 & \ldots & \\ \ldots & & \ldots & \\ \sigma_{1k} & & \ldots & \sigma_{kk}^2 \end{pmatrix}, \text{ where}$$

$$\sigma_{jj}^2 = [(Y_{1j} - \mu_j)^2 + (Y_{2j} - \mu_j)^2 + \ldots + (Y_{nj} - \mu_j)^2]/(n-1) \text{ and}$$

$$\sigma_{ij} = [(X_{1i} - \mu_i)(X_{1j} - \mu_j) + (X_{2i} - \mu_i)(X_{2j} - \mu_j) + \ldots + (X_{ni} - \mu_i)(X_{nj} - \mu_j)]/(n-2)$$

Using the above calculations, two likelihoods (an A and a B) can be calculated for each set X and Y. Once "trained" in this manner, a system such as depicted in FIG. 1 and/or those using the methods of FIGS. 2 and 3 can determine the probability of a defect in a newly manufactured DUT. The results of a test run on a newly manufactured unit using test method X, can be represented by the k dimensional vector $X_{new}$:

$$X_{new} = \begin{pmatrix} X_1 \\ \ldots \\ X_k \end{pmatrix}$$

For each vector of measurements, embodiments can then calculate a likelihood that DUT tested contains a defect. In the example methods of FIGS. 2 and 3, four likelihoods would should be calculated: a likelihood that test X has found a defect; a likelihood that test X has not found a defect; a likelihood that test Y has found a defect; and a likelihood Y has not found a defect. For example, the Gaussian likelihood that $X_{new}$ represents a test method X result of defect free DUT would be:

$$G(X_{new}) = \frac{1}{\sqrt{(2\pi)^k \det(\Sigma)}} \exp\left\{-\frac{1}{2}(X - \overline{\mu})^t \sum\nolimits^{-1} (X - \overline{\mu})\right\}, \qquad (1)$$

where $\det(\Sigma)$ stands for the determinant of $\Sigma$,
$\Sigma^{-1}$ stands for the matrix inverse of $\Sigma$,
$(X-\overline{\mu})'$ stands for matrix transpose of $(X-\overline{\mu})$,
$(X-\overline{\mu})$ is a vector subtraction, and
the multiplications within the { } are matrix multiplications.

A new vector of measurements using test method Y may be represented as:

$$Y_{new} = \begin{pmatrix} Y_1 \\ \ldots \\ Y_k \end{pmatrix}$$

The Gaussian likelihood that $Y_{new}$ represents a test method Y measurement of a defect free DUT would be:

$$G_A(Y_{new}) = \frac{1}{\sqrt{(2\pi)^k \det(\Sigma)}} \exp\left\{-\frac{1}{2}(Y - \overline{\mu})^t \sum\nolimits^{-1} (Y - \overline{\mu})\right\}, \qquad (2)$$

where $\det(\Sigma)$ stands for the determinant of $\Sigma$,
$\Sigma^{-1}$ stands for the matrix inverse of $\Sigma$,
$(Y-\overline{\mu})'$ stands for matrix transpose of $(Y-\overline{\mu})$,
$(Y-\overline{\mu})$ is a vector subtraction, and
the multiplications within the { } are matrix multiplications.

For each measurement of a new DUT that uses methods X and Y, two Gaussian likelihoods $G_A$ and $G_B$, could be calculated for each method, where $G_A(X_{new})$ likelihood the DUT is defect free according to X, $G_B(X_{new})$ is the likelihood the DUT has a defect according to X, $G_A(Y_{new})$ is the likelihood the DUT is defect free according to Y, and $G_B(Y_{new})$ is the likelihood the DUT has a defect according to Y.

Likelihoods are more useful when they expressed as probabilities (or confidences (C)). To convert Gaussian likelihoods $G_A(X_{new})$ and $G_B(X_{new})$ into probabilities $C_A(X_{new})$ and $C_B(X_{new})$, respectively:

$$C_A(X_{new}) = \frac{G_A(X_{new})}{G_A(X_{new}) + G_B(X_{new})} \quad (3)$$

Note here $$C_A(X_{new}) = 1 - C_B(X_{new})$$

Once the confidence of each measurement method is determined, embodiments may mathematically combine the results to then produce a determination, based on both techniques, that a DUT has a defect, such as in step 307 of FIG. 3. One manner of mathematical combination is the well known Bayesian Voting Formula described in Jayne, E. T. *Probability Theory: The Logic of Science*, Cambridge University Press. (2003). According to this formula:

$$C_A(X, Y) = \frac{C_A(X)C_A(Y)}{C_A(X)C_A(Y) + (1 - C_A(X))(1 - C_A(Y))} \quad (4)$$

$C_A(X, Y)$ therefore represents a probability that a manufactured DUT contains a defect, and is an efficient use of multiple testing techniques of varying accuracy.

Tables 1 and 2 are example feature sets from a IC component measured using an optical inspection machine.

TABLE 1

| Good data | Feature 1 | Feature 2 | Feature 3 | Feature 4 |
|---|---|---|---|---|
| Data point 1 | 43 | 39 | 69 | 3 |
| Data point 2 | 11 | 36 | 79 | 7 |
| Data point 3 | 24 | 38 | 79 | 5 |

TABLE 2

| Good data | Feature 1 | Feature 2 | Feature 3 | Feature 4 |
|---|---|---|---|---|
| Data point 1 | 29 | 37 | 18 | 5 |
| Data point 2 | 28 | 38 | 19 | 6 |
| Data point 3 | 30 | 37 | 20 | 6 |

Figure 4:
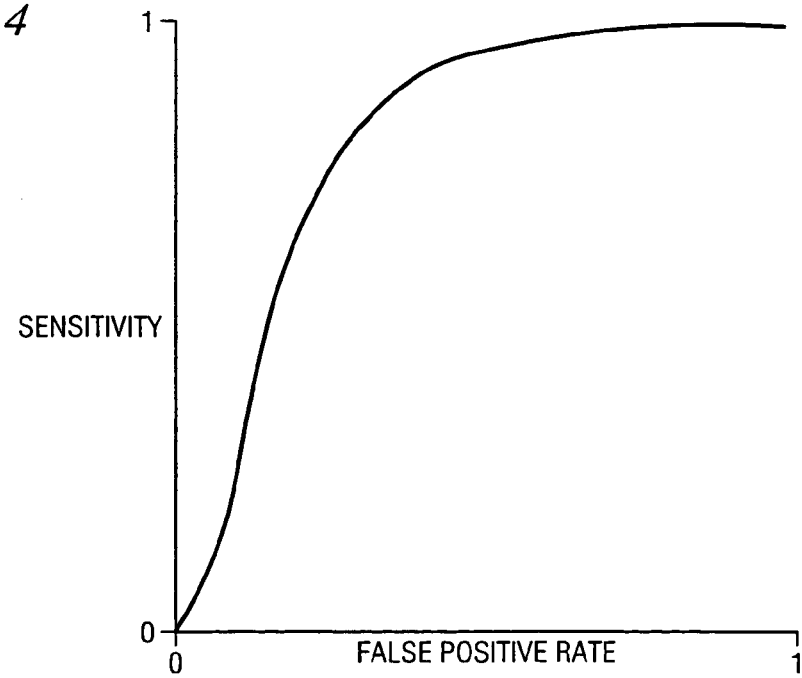
FIG. 4 represents a Receiver Operating Characteristics (ROC) graph based upon the data of Tables 1 and 2.

FIG. 4 represents a Receiver Operating Characteristics (ROC) graph based upon the data of Tables 1 and 2. In graph 400, X-axis is false call rate which is defined as the number of false calls divided by the number of data points inspected, and Y-axis is the sensitivity, which is defined as the percentage of defects caught by the classifier.

The ROC graph of FIG. 4 was generated by:
1. Computing the confidence numbers for each element in the training set.
2. Adjust the threshold from 0 to 1. For each value, compare the true class of the element to the class decided by thresholding the confidence numbers.
3. The false call rate is the rate of class A being called class B based on the thresholding procedure. The escape rate is the rate of class B being called class A.
4. ROC curve plots the false call rate versus the 1-escape rate for each threshold.

When implemented via computer-executable instructions, various elements of embodiments of the present invention are in essence the software code defining the operations of such various elements. The executable instructions or software code may be obtained from a readable medium (e.g., a hard drive media, optical media, EPROM, EEPROM, tape media, cartridge media, flash memory, ROM, memory stick, and/or the like) or communicated via a data signal from a communication medium (e.g., the Internet). In fact, readable media can include any medium that can store or transfer information.

Figure 5:
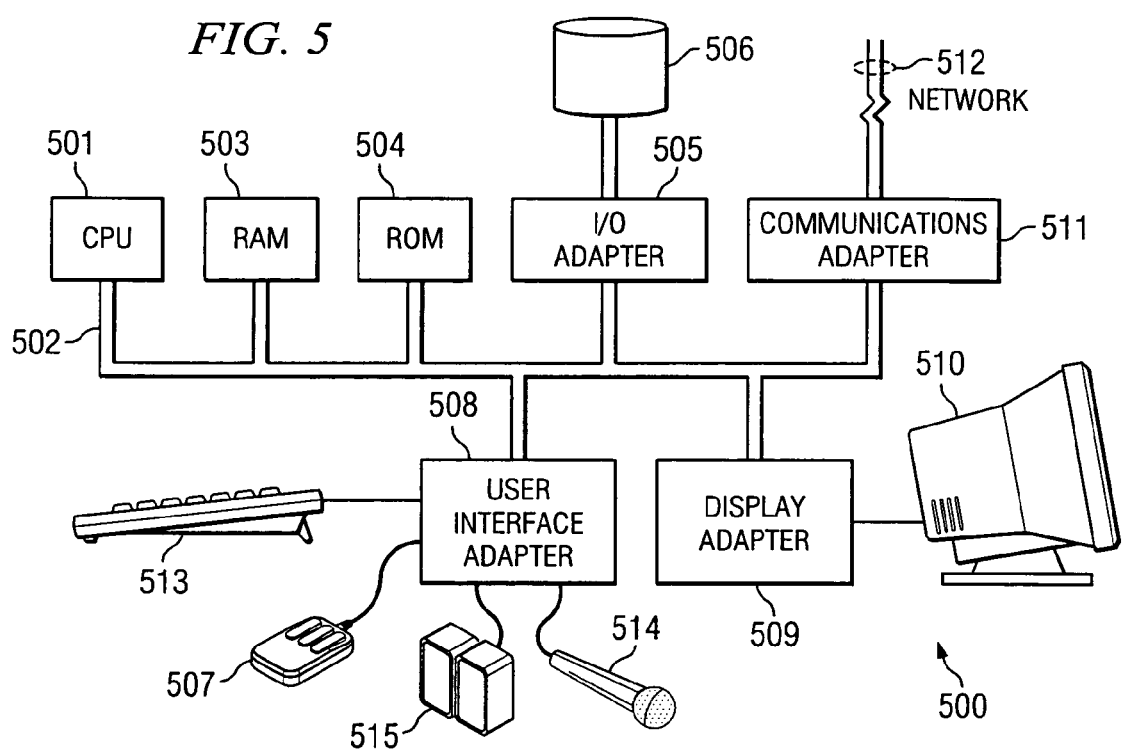
FIG. 5 illustrates an example computer system adapted according to embodiments of the present invention.

FIG. 5 illustrates an example computer system 500 adapted according to embodiments of the present invention. That is, computer system 500 comprises an example system on which embodiments of the present invention may be implemented. Central processing unit (CPU) 501 is coupled to system bus 502. CPU 501 may be any general purpose CPU. Suitable processors include without limitation INTEL's PENTIUM® 4 processor, as an example. However, the present invention is not restricted by the architecture of CPU 501 as long as CPU 501 supports the inventive operations as described herein. CPU 501 may execute the various logical instructions according to embodiments of the present invention. For example, CPU 501 may execute machine-level instructions according to the exemplary operational flows described above in conjunction with FIG. 2 or 3.

Computer system 500 also preferably includes random access memory (RAM) 503, which may be SRAM, DRAM, SDRAM, or the like. Computer system 500 preferably includes read-only memory (ROM) 504 which may be PROM, EPROM, EEPROM, or the like. RAM 503 and ROM 504 hold user and system data and programs, such as programs capable of analyzing the vectors and matrices described above.

Computer system 500 also preferably includes input/output (I/O) adapter 505, communications adapter 511, user interface adapter 508, and display adapter 509. I/O adapter 505, user interface adapter 508, and/or communications adapter 511 may, in certain embodiments, enable an operator to interact with computer system 500 allowing the operator to, for example, alter the number of standards used or to preset the measurement points used in a particular test.

I/O adapter 505 preferably connects to storage device(s) 506, such as one or more of hard drive, compact disc (CD) drive, floppy disk drive, tape drive, etc. to computer system 500. The storage devices may be utilized when RAM 503 is insufficient for the memory requirements associated with storing data for user information. Communications adapter 511 is preferably adapted to couple computer system 500 to network 512. User interface adapter 508 couples user input devices, such as keyboard 513, pointing device 507, and microphone 514 and/or output devices, such as speaker(s) 515 to computer system 500. Display adapter 509 is driven by CPU 501 to control the display on display device 510 that can be used to display the results of each test as well as the results of the mathematical combination of those results.

It shall be appreciated that the present invention is not limited to the architecture of system 500. For example, any suitable processor-based device may be utilized, including without limitation personal computers, laptop computers, computer workstations, and multi-processor servers. Moreover, embodiments of the present invention may be implemented on application specific integrated circuits (ASICs) or very large scale integrated (VLSI) circuits. In fact, persons of ordinary skill in the art may utilize any number of suitable structures capable of executing logical operations according to the embodiments of the present invention.

Although the present invention and its advantages have been described in detail, it should be understood that various changes, substitutions and alterations can be made herein without departing from the invention as defined by the appended claims. Moreover, the scope of the present application is not intended to be limited to the particular embodiments of the process, machine, manufacture, composition of matter, means, methods and steps described in the specification. As one will readily appreciate from the disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. A method for determining that a unit is defective, said method comprising:
   testing a unit with a plurality of defect detecting techniques;
   generating weighted results of said defect detecting techniques, wherein said weighting is related to an accuracy of said techniques;
   determining a probability that said unit has a defect, wherein said determination is made by combining said weighted results from said defect detecting techniques;
   testing at least one standard unit having at least one known defect;
   testing at least one standard unit which is substantially free of defects; and
   wherein said accuracy of each said technique is determined by comparing results obtained by performing each said technique on each said at least one standard unit with anticipated results for each said at least one standard unit.

2. The method of claim 1 further comprising:
   determining said accuracy of each said technique by comparing results for each said technique performed on a standard with expected results for said standard.

3. The method of claim 2 wherein said accuracy determination uses a Gaussian model.

4. The method of claim 1 further comprising:
   calculating a likelihood for each said technique by mathematically combining said results for said technique and said accuracy for said technique.

5. The method of claim 4 further comprising:
   calculating a probability that said unit has a defect by mathematically combining said likelihoods.

6. The method of claim 5 wherein said likelihoods are converted to probabilities and are combined using a Bayesian Voting Formula.

7. A system for evaluating a unit, said system comprising:
   a plurality of testing techniques, wherein each said technique detects the presence of at least one characteristic, and wherein an accuracy of each said technique can be determined;
   means for analyzing results of said techniques that determines a probability that said at least one characteristic is detected by using a combination of each technique's results and each said technique's accuracy, wherein said probability is used to evaluate said unit;
   at least one standard having at least one known defect;
   at least one standard which is substantially free of defects; and
   wherein said accuracy of each said technique is determined by comparing results obtained by performing each said technique on each said at least one standard with anticipated results for each said at least one standard.

8. The system of claim 7 further comprising:
   at least one standard having a known characteristic profile, wherein said at least one standard is used to determine said accuracy for each said technique.

9. The system of claim 7 wherein said at least one characteristic is a defect.

10. A computer readable storage medium storing computer executable code for evaluating a unit, said code comprising:
    code for calculating a confidence factor for each of a plurality of tests;
    code for combining results from each of said test with said confidence factor for that test producing a likelihood for each said test; and
    code for combining said likelihoods to arrive at a determination regarding a unit tested by each said test.

11. The computer readable storage medium of claim 10 wherein said determination relates to whether said unit is defective.

12. The computer readable storage medium of claim 10 further comprising:
    code for changing each said likelihood into a probability; and
    code for combining said probabilities using a Bayesian Voting Formula.

13. The computer readable storage medium of claim 10 further comprising:
    code for comparing results that each said test produces for a standard with results that are anticipated for said standard, wherein said comparison is used in said calculation of said confidence factors.

14. The computer readable storage medium of claim 10 wherein said determination produces at least one graph of a receiver operating characteristic.

15. A method of evaluating a unit, said method comprising:
    providing a plurality of testing techniques for detecting defects in said unit;
    testing at least one standard using each said technique, wherein said at least one standard has a known defect profile;
    calculating a weighting factor for each said technique from results of said at least one standard testing; and
    testing said unit using each said technique, wherein an acceptability of said unit is determined from a combination of said unit testing results, and said weighting factors.

16. The method of claim 15 further comprising:
    producing a first feature set by testing a standard having at least one known defect;
    producing a second feature set by testing a standard which is substantially free of defects; and
    generating a statistical measurement of accuracy for each said technique from said first and second feature sets.

17. The method of claim 16 wherein said generating uses a Gaussian model.

18. The method of claim 15 wherein at least one of said techniques is an optical technique for the detection of defects on printed circuit boards.

19. The method of claim 15 wherein at least one said technique is an electrical conductivity technique.

* * * * *